(12) United States Patent
Peng

(10) Patent No.: US 8,373,402 B2
(45) Date of Patent: Feb. 12, 2013

(54) METHOD OF DIGITAL CONTROL OF PWM CONVERTERS ACHIEVING FAST TRANSIENT RESPONSE AND LOW STEADY-STATE JITTERING

(75) Inventor: Hao Peng, Sunnyvale, CA (US)

(73) Assignee: Semtech Corporation, Camarillo, CA (US)

( * ) Notice: Subject to any disclaimer, the term of this patent is extended or adjusted under 35 U.S.C. 154(b) by 761 days.

(21) Appl. No.: 12/552,051

(22) Filed: Sep. 1, 2009

(65) Prior Publication Data

US 2010/0066324 A1    Mar. 18, 2010

Related U.S. Application Data

(60) Provisional application No. 61/096,543, filed on Sep. 12, 2008.

(51) Int. Cl.
*G05F 1/00* (2006.01)
(52) U.S. Cl. ...................................................... 323/283
(58) Field of Classification Search .................... 323/283
See application file for complete search history.

(56) References Cited

U.S. PATENT DOCUMENTS

| | | | |
|---|---|---|---|
| 6,885,176 | B2 | 4/2005 | Librizzi |
| 7,428,159 | B2 * | 9/2008 | Leung et al. ................... 323/284 |
| 7,586,767 | B1 * | 9/2009 | Prodic et al. ................... 323/282 |
| 2008/0252279 | A1 * | 10/2008 | Wang ............................. 323/283 |
| 2009/0015231 | A1 * | 1/2009 | Wu et al. ........................ 323/282 |

OTHER PUBLICATIONS

Patella et al., High-Frequency Digital Converter IC for DC/DC Converter, 2002, IEEE, pp. 374-380.*
"A Digital PWM Regulator Based on Serial Error Correcting Mechanism for DC-DC Buck Conversion" Huang et al.; Department of Electrical Engineering, Fu Jen Catholic University, Taiwan; 2006; pp. 143-146.

* cited by examiner

*Primary Examiner* — Jue Zhang
(74) *Attorney, Agent, or Firm* — O'Melveny & Myers LLP

(57) ABSTRACT

A pulse width modulator (PWM) control system for a power converter achieves a fast transient response and low steady-state jittering. The control system manages the ADC sample timing to reduce noise susceptibility, and the ADC includes a regulation bin or dead band to minimize large phase corrections and thus eliminate limit cycling. The PWM module includes a dithering circuit to accumulate fractional PWM control signals to reduce period jitter by increasing the effective resolution of the pulse width modulator.

23 Claims, 4 Drawing Sheets

METHOD OF DIGITAL CONTROL OF PWM CONVERTERS ACHIEVING FAST TRANSIENT RESPONSE AND LOW STEADY-STATE JITTERING

RELATED APPLICATIONS

This application claims the benefit, under 35 U.S.C. §119, of U.S. provisional application Ser. No. 61/096,543, filed Sep. 12, 2008, the entirety of which is incorporated herein by reference.

BACKGROUND OF THE INVENTION

1. Field of the Invention

The invention relates generally to the field of power converters controlled through digital pulse-width modulation (PWM). More particularly, the invention relates to a digital control scheme for PWM converters that enables a fast transient response to be achieved while maintaining very low steady-state jittering.

2. Description of Related Art

The use of pulse-width modulation (PWM) to control the output voltage of a power converter is well known. FIG. 1 illustrates a simplified PWM control circuit for a buck-type power converter that is typical of the prior art. A primary voltage 106 is selectively applied to an inductor 114 by a switch 108. When the switch 108 is closed, the diode 110 is reverse biased, and the current through the inductor 114 rises linearly as it stores magnetic energy. When the switch 108 is opened, the inductor energy is discharged to the output 112 as the inductor's magnetic field collapses. As the switching cycle is repeated, the output voltage thus achieves a level that is related to the input voltage 106 and is dependent on the duty cycle of the switch 108. For a buck conversion circuit such as that shown in FIG. 1, the output voltage, $V_{out}$, is related to the input voltage $V_{in}$ by the expression $V_{out}=V_{in} \times D$, where D is the duty cycle, or the fraction of the switching period during which the switch is closed. In other words, the output voltage level is set by controlling the duty cycle of the switch 108.

Controlling the duty cycle of switch 108 can be performed by an analog PWM control loop as illustrated in FIG. 1. The output voltage 112 is scaled and compared to a desired reference voltage 102, and an error voltage signal 116 is produced, reflecting the deviation of the output voltage 112 from the desired regulation point 102. The error voltage is then compared with a periodic ramp waveform 104, and the resulting PWM voltage is used to drive the switch 108.

FIG. 2 depicts the voltage ramp waveform 202, an error voltage 204, and the resulting PWM waveform 206 plotted as a function of time 208. In this example, the error voltage 204 is relatively low compared to the center of the ramp voltage 202, resulting in a PWM waveform 206 exhibiting a relatively large duty cycle that will cause the output voltage to rise, reducing the error voltage. While this example is described with respect to a particular buck converter topology, the same principles are employed for other types of switched power converters.

Moving from analog to digital PWM control systems provides a number of advantages including in situ programmability to fit a wide variety of applications, expanded control functionality, and adaptive control algorithms, among others. FIG. 3 is a simplified block diagram, typical of the prior art, of a power converter employing a digital PWM control loop. A switching converter 304 operates in a manner similar to the circuit of FIG. 1 to convert an input voltage 302 to an output voltage 306. The output voltage 306 is then digitized by an analog-to-digital converter (ADC) 308 to produce a digital output voltage sample 324. This digital output voltage sample is subtracted from a digital reference sample 312 to create a digital error sample 314. The error sample is processed by a digital compensator filter 316, which generally has a proportional-integral-differential (PID) character, to produce a digital control signal 318 that drives a digital PWM circuit, generally implemented as a digital counter or as a mixed-signal device. The PWM output waveform 322 is then used to drive the switching element of the switching converter 304 to provide closed-loop control of the output voltage 306. The digital nature of the compensator 316 provides flexibility in the filtering operation that cannot be achieved in a purely analog system. In addition, the digital PWM circuit 320 is programmable and allows the converter to be used in a variety of applications.

However, digital control systems also raise certain performance issues that stem from the quantization of time and voltage amplitude. In particular, the resolution of output voltage control depends on the ratio of the PWM switching frequency to the sampling clock of the system. Measured in number of bits, the resolution is given by $\text{Log}_2(T_{SW}/T_{DPWM})$, where $T_{SW}$ is the switching period of the digital PWM circuit and $T_{DPWM}$ is the clock period used to implement the digital PWM. In typical point-of-load applications, the switching frequency can be as high as one megahertz, and the input-to-output voltage ratio can be ten, as in a typical 12 V-to-1.2 V conversion system. Given 1% regulation requirements, the PWM clock frequency is thus required to be in the range of several gigahertz. Implementing such a high-frequency clock adds complexity, power consumption, and cost and is thus undesirable.

An additional performance issue raised by digital PWM systems is a phenomenon known as limit cycling. When a digital PWM circuit does not have sufficient resolution, periodic low-frequency oscillation can be observed at the output. This low-frequency oscillation can result in excessive output voltage ripple, often in the range of a few percent, which is unacceptable for many applications.

A lack of sufficient resolution in the digital PWM can result in another phenomenon called jittering. Without sufficient DPWM resolution, the output error voltage cannot remain within the zero-error bin. When the error voltage is not inside the zero-error bin, a duty-cycle correction command will be initiated, resulting in a duty-cycle change. This duty-cycle change, observed at the phase node, is the jittering of the system. This measure is used by many customers to decide whether or not the power stage is in a good state of regulation. High jittering means the controller needs to employ frequent, large duty-cycle corrections, suggesting that the system is not in a very stable condition. In a system with lower jittering, the controller must make only small duty-cycle corrections, keeping the output voltage in a state of tight regulation.

Accordingly, it would be desirable to provide a digital PWM control system and method that addresses the issues discussed above. In particular, it would be desirable to provide a method of reducing phase-node jittering and output voltage ripple without requiring a very-high-resolution digital PWM circuit and very high clock rates. And it would be useful to decouple the transient response of the system from the jittering such that a fast transient response could be achieved without increasing the phase-node jittering. Finally, it would be useful to reduce the susceptibility of the digital PWM control system to noise within the regulation bin surrounding the operating point at which the output voltage is very close to its control value.

SUMMARY OF THE INVENTION

An embodiment of a power conversion system in accordance with the present invention includes a switching converter, such as a buck converter, boost converter, or other switching converter known in the art, including an input voltage port, an output voltage port, an output voltage filter, and at least one switch for selectively connecting the input voltage port to the output voltage filter. When the switch is opened and closed periodically, the output voltage takes on a value that is related to the input voltage and the duty cycle of the switch.

The power conversion system also includes an analog-to-digital converter (ADC) for sampling the output voltage of the switching converter. As described in more detail below, the ADC exhibits a non-uniform response function such that it includes a regulation bin or dead band surrounding the null output region so that a small change in the output voltage of the switching converter will not result in a change to the digital output of the ADC. This eliminates the problem of limit cycling in the power conversion system as discussed in more detail below. In some embodiments in accordance with the present invention, the width of the regulation bin is programmable. In one specific embodiment, the width of the regulation bin is set to extend from −4 millivolts to +4 millivolts.

An embodiment of a power conversion system in accordance with the present invention further includes an error circuit configured to calculate an error signal by taking a difference of the digital output of the ADC and a reference voltage. This error signal is sent to a compensator filter that processes the error signal to generate a pulse width modulation (PWM) control signal. In some embodiments of the power conversion system in accordance with the present invention, the compensator has a proportional, integral, and differential (PID) characteristic response function. This response function is described in some embodiments by the relation $d[n]=d[n-1]+b0*e[n]-b1*e[n-1]+b2*e[n-2]$. In this expression, $d[n]$ is the PWM control signal at a current sample time t, $d[n-1]$ is the PWM control signal at a sample time t−1, $e[n]$ is the error signal at the current sample time t, $e[n-1]$ is the error signal at the sample time t−1, $e[n-2]$ is the error signal at a sample time t−2, b0 is a first filter coefficient, b1 is a second filter coefficient, and b2 is a third filter coefficient. In one particular embodiment in accordance with the present invention, the filter coefficients take on the following values: b0=1, b1=1.8125, and b2=0.8203125.

The power conversion system further comprises a PWM module that is configured to receive the PWM control signal and to produce an output PWM waveform with a variable duty cycle that is used to drive the switch of the switching converter. The duty cycle of the PWM waveform is controlled by a numerically controlled oscillator or similar circuit in response to the PWM control signal. The PWM module further generates a timing strobe that is sent to the ADC to control the timing instant at which it samples the output voltage. In order to reduce ADC noise, the sampling instant is chosen to occur when the switch of the switching converter is in the off state. In some embodiments in accordance with the present invention, the sampling instant is further constrained to occur in the instant before the switch of the switching converter is turned on.

In some embodiments of a power conversion system, the PWM module is further adapted to include a dithering circuit to prevent large phase correction jumps from occurring when the PWM control signal includes a fractional portion. The PWM control signal will generally include a fractional portion when the resolution of the compensator filter is greater than that of the numerically controlled oscillator or similar circuit generating the PWM waveform. In order to capture the fractional portion of the PWM control signal, the dithering circuit includes a remainder accumulator that receives the fractional portion of the PWM control signal and accumulates it from sample to sample to create a rolling remainder sum. When the rolling remainder sum reaches or exceeds one, the duty cycle of the current PWM pulse is increased by one least-significant bit (LSB) time. It may be the case that the fractional portions of the PWM control word do not evenly add to an integer value after several cycles. In this case, some embodiments of the dithering circuit will simply retain the fractional portion of the rolling sum and discard the integer portion that was used to correct the duty cycle of the PWM waveform. This is equivalent to replacing the rolling sum with the rolling sum minus one whenever the rolling sum reaches or exceeds one. In other embodiments, the rolling sum may be reset to zero whenever the rolling sum reaches or exceeds one.

While the PWM control system of the present invention has been described above in the context of a voltage conversion system, it is equally applicable to other closed-loop control systems. Those skilled in the art will realize other applications and benefits of the invention described herein by a study of the detailed description below and the attached drawings, which will first be described briefly.

DETAILED DESCRIPTION OF THE PREFERRED EMBODIMENT

An embodiment of a digital PWM control system in accordance with the present invention provides low steady-state jittering that is limited to one cycle of the system clock while including a digital PWM circuit that is relatively low resolution and capable of being implemented using standard digital design and fabrication techniques. It also employs a non-uniform ADC characteristic that eliminates limit cycling and allows programmability of the regulation bin. It also includes a dithering function that effectively increases the resolution of the PWM circuit.

Figure 1:
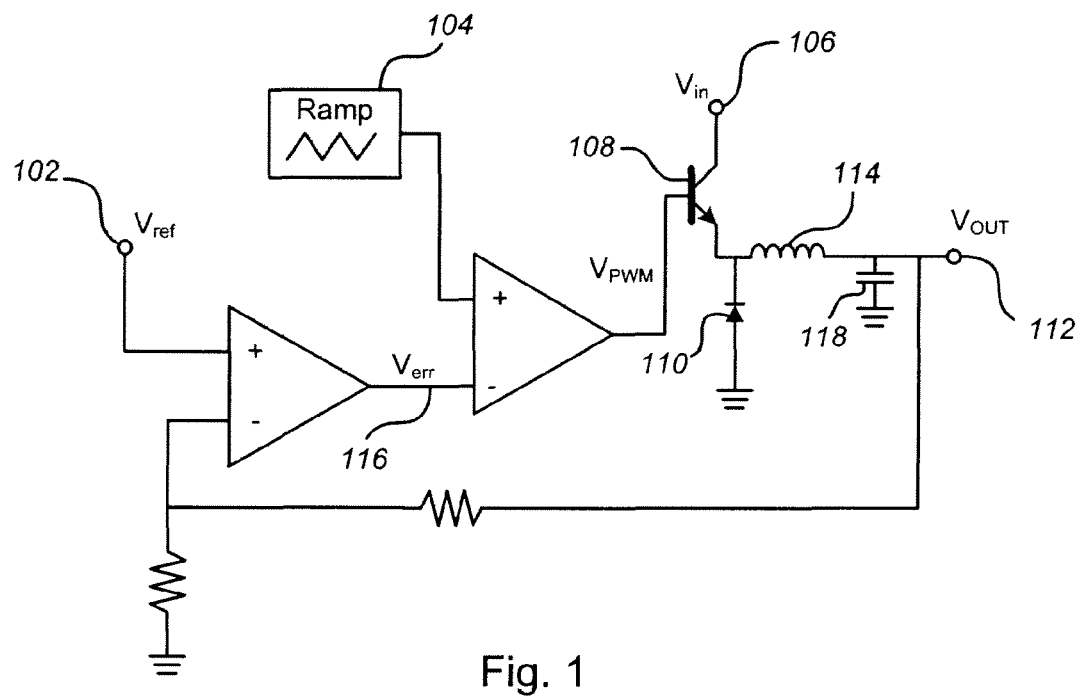
FIG. 1 is a block diagram of a typical buck converter controlled by an analog PWM circuit.
Figure 2:
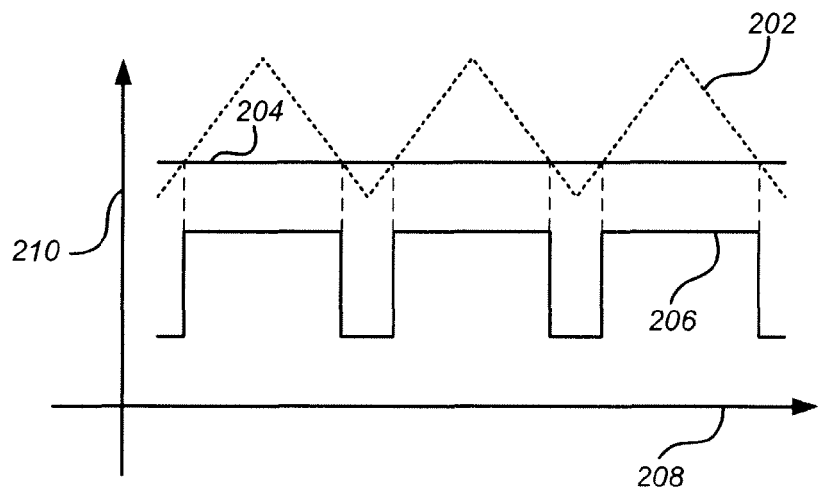
FIG. 2 is a diagram illustrating the waveform of a ramping circuit and the resulting PWM waveform.
Figure 3:
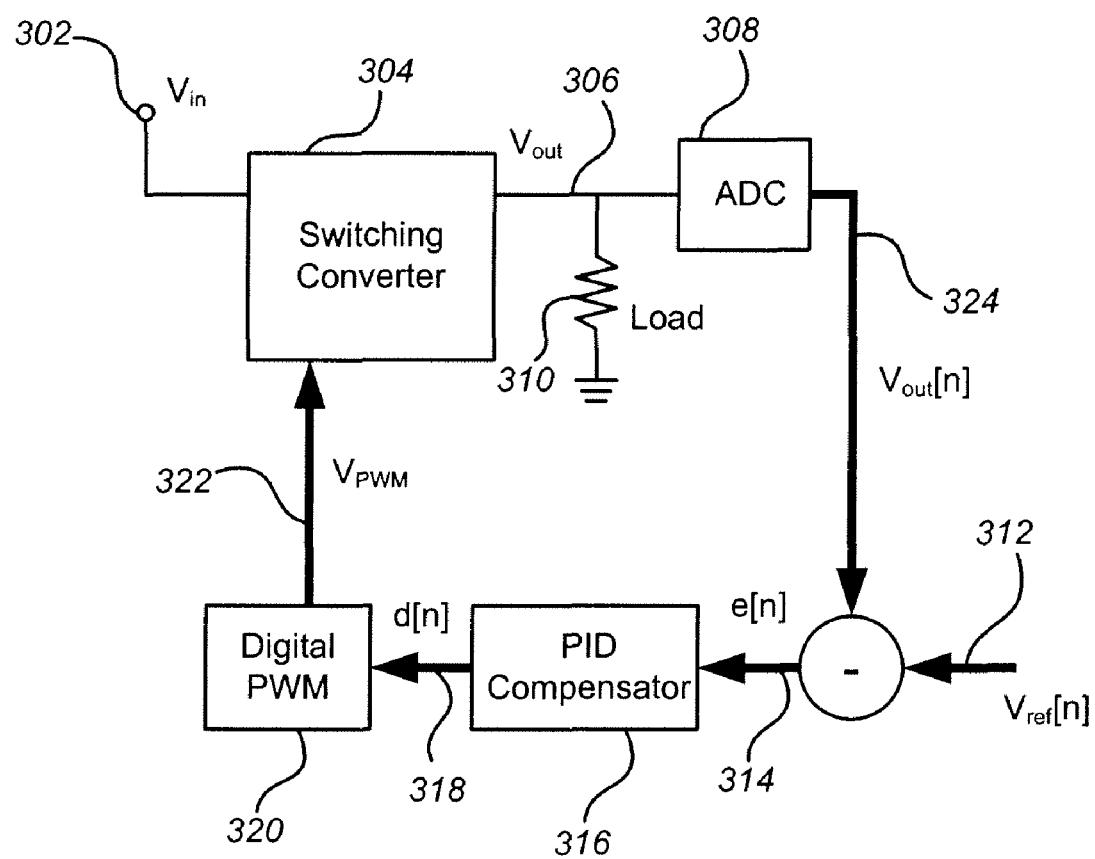
FIG. 3 is a block diagram of a typical power converter employing a digital PWM control circuit.
Figure 4:
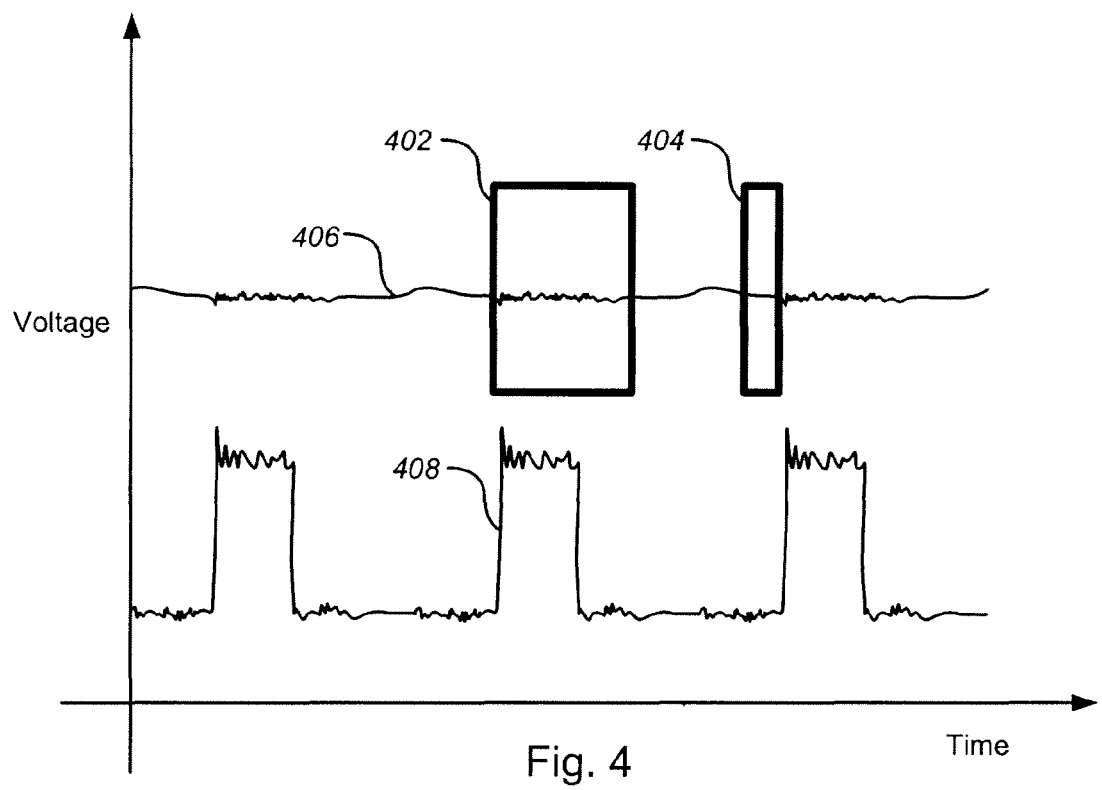
FIG. 4 is a plot of a phase-node waveform and an output voltage of a digital PWM power converter circuit in accordance with an embodiment of the present invention.

In one embodiment of a digital PWM system in accordance with the present invention, the sampling noise associated with measuring the output voltage of the power converter with the ADC is minimized by setting the sampling window strobe to occur just prior to the rising edge of the phase-node signal of a buck converter. FIG. 4 illustrates how this sampling instant is selected. A representative phase-node waveform 408 comprises a train of pulses adapted to turn on and off the high-side FET in a buck converter. The voltage output trace 406 of the power converter shows increased noise during the time that the phase-node waveform is high. The time region of increased noise is indicated by the highlighted box 402. A power converter in accordance with the present invention is adapted to prevent ADC samples of the output voltage from being acquired during this enhanced noise interval. Instead, the sampling is timed to occur during the quiet interval highlighted at 404. Much of the circuit noise is thus eliminated from the ADC samples, leading to a cleaner calculation of the error signal fed into the compensator.

Figure 5:
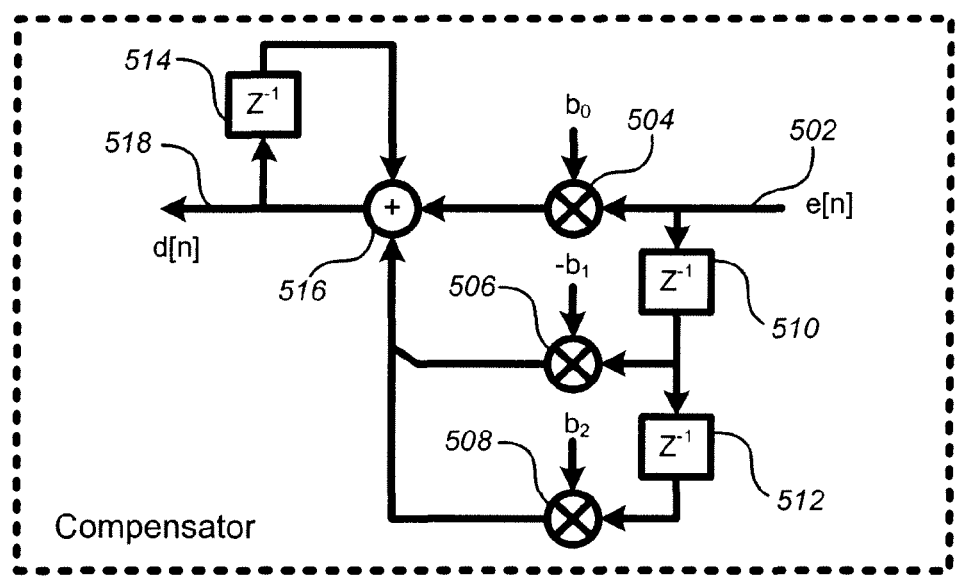
FIG. 5 is a block diagram of an embodiment of a compensator filter used to drive a digital PWM synthesizer in accordance with the present invention.

An embodiment of a compensator filter in accordance with the present invention is depicted in FIG. 5. An error sample 503 is processed by a digital filter to produce an output 518 suitable for driving the digital PWM circuit. As shown in FIG. 5, an example of such a filter includes two input-sample-delay stages 510 and 512 and three multipliers 504, 506, and 508, configured to scale the current error sample, the previous error sample, and the two-sample-previous error sample by programmable coefficients $b_0$, $-b_1$, and $b_2$, respectively. The scaled error samples are then combined, along with the previous output sample to produce an output 518 that can be described as follows:

$$d[n]=d[n-1]+b_0*e[n]-b_1*e[n-1]+b_2*e[n-2],$$

where e[n] is the current error sample, e[n−1] and e[n−2] are the error samples from one sample time and two sample times previously, respectively, d[n] is the current output sample, and d[n−1] is the previous output sample. Adjusting the coefficients $b_0$, $b_1$, and $b_2$ allows different transient responses of the compensator filter to be achieved. Note that multipliers 504, 506, and 508 can be implemented as true multipliers for maximum flexibility in coefficient selection, or they can be implemented with a look-up table to conserve computation resources.

The output d[n] is a measure of the calculated PWM duty cycle to be applied to the power converter in order to move the output voltage toward the regulation point. It should be appreciated that the resolution of the compensator calculation may be greater than that of the PWM synthesis circuit and thus may include a portion corresponding to a fraction of a least-significant bit of the PWM circuit. Prior art systems tend to address this problem by increasing the PWM resolution. However, this requires either a digital system with a clock frequency in the range of several gigahertz, or a mixed-signal system with a very-high-resolution DPWM. These techniques add complexity and often push the design of the PWM synthesizer to faster and more exotic semiconductor technologies that can increase price and power consumption and reduce yield.

Figure 6:
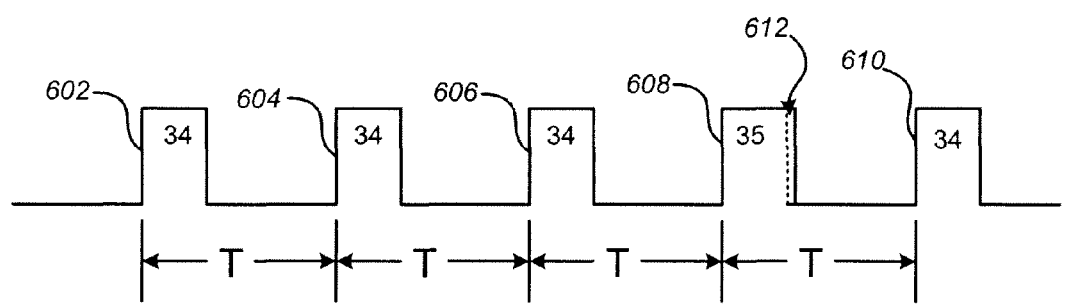
FIG. 6 is a plot of several cycles of a PWM waveform illustrating a dithering technique in accordance with an embodiment of the present invention.

By contrast, an embodiment of a digital PWM control system in accordance with the present invention employs a dithering technique that effectively increases the resolution of the DPWM while maintaining an affordable operating frequency and a purely digital design. The dithering technique includes a mechanism for retaining the fractional portion of the duty cycle calculated by the compensator filter. For example, FIG. 6 illustrates this technique for representing a PWM duty cycle value of 34.25 units using a PWM synthesizer with a least-significant-bit value of one unit. In this case, the compensator calculates an ideal PWM value of 34.25. When this value is applied to the PWM synthesizer, the 0.25 fractional portion is retained in a remainder accumulator circuit, and the value of 34 is applied to the PWM synthesizer which then generates a pulse 602 having a duty cycle of 34. During the following cycle, an additional 0.25 remainder is accumulated, resulting in a retained value of 0.5, and the value of 34 is again applied resulting in a second pulse 604 of duty cycle 34. The process is again repeated resulting in a third pulse 606 of duty cycle 34 and a remainder accumulator value of 0.75. Finally, during the fourth cycle, the remainder accumulator value reaches 1.0, and the value sent to the PWM synthesizer is 35, resulting in a pulse 608 with a slightly larger duty cycle of 35, as illustrated by the extra pulse length depicted at 612. The remainder accumulator is cleared, and the following pulse 610 again has a duty cycle of 34. The result of this process is that an average duty cycle of 34.25 is obtained with predictable phase-node jittering of just one sampling clock cycle, as illustrated at 612. Thus the effective resolution of the PWM modulator is increased by two bits (four states) without increasing the clock frequency of the PWM circuit. The remainder accumulator can be implemented using digital design techniques well-known in the art such as by implementing a simple digital accumulator circuit, by using a microprocessor, or by any other suitable technique. By making the jittering predictable and constraining its magnitude to one clock cycle, limit cycling due to insufficient PWM resolution is eliminated because the PWM synthesizer synthesizes the precise calculated value (on average) rather than relying on a very-high-frequency digital implementation.

While the dithering process has been described with respect to a fractional value of one quarter, resulting in one of every four pulses being slightly wider than the others, other fractional values can be similarly accommodated within the scope and spirit of the present invention. For example, a fractional value of one eighth would result in every eighth pulse's being wider by one clock cycle. Similarly, a fractional value of ⅔ would result in every third pulse's being one clock cycle narrower than the others. In some cases, the fractional portions after several cycles will not add exactly to one. In such a case, the duty cycle of the PWM waveform will be increased by one unit at the sample time at which the remainder accumulator rolling sum reaches or exceeds one. In one embodiment in accordance with the present invention, when this happens, the remainder accumulator will be reset to zero. In another embodiment in accordance with the present invention, the value of the remainder accumulator will be replaced by the value of the remainder accumulator minus one, i.e., only the fractional portion will be retained.

In all cases, the period jitter is constrained to be just one clock cycle, which is in many cases much smaller than the jitter that would result if a truncated duty cycle value were applied to the PWM processor and the loop were allowed to close through the ADC and compensator filter. For example, for a reasonable clock frequency of 200 MHz, well within the capabilities of standard digital processes, the jitter resulting from a system in accordance with the present invention would be limited to 5 ns, which is significantly lower than typical prior art systems.

Figure 7:
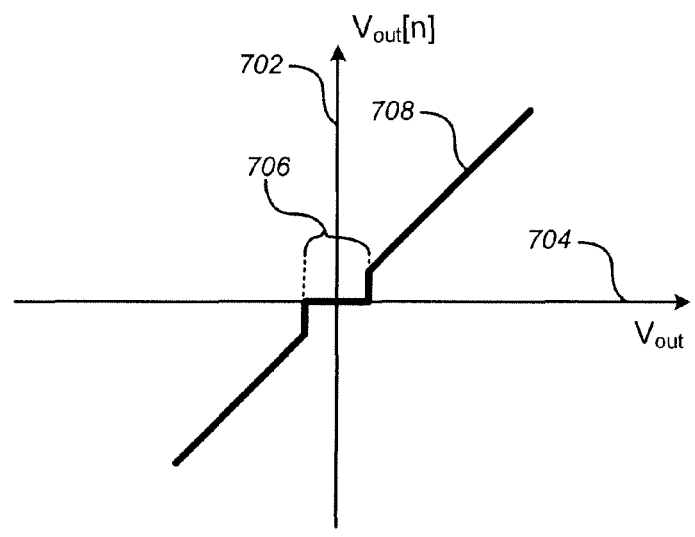
FIG. 7 is a plot of a non-uniform ADC characteristic in accordance with an embodiment of the present invention.

However, even when the dithering technique described above is applied, ADC quantization noise can still produce unwanted jittering and corresponding output voltage noise. To solve this problem, an embodiment of a PWM control system in accordance with the present invention employs a non-uniform ADC characteristic function that defines a regulation bin spanning the region near which the error voltage is zero and inside which the ADC response is defined to be zero. FIG. 7 depicts an exemplary ADC characteristic in accordance with the present invention that illustrates the operation of the regulation bin. The analog error voltage of the converter is plotted along the horizontal axis 704, and the corresponding digital output of the ADC is plotted along the vertical axis 702. Trace 708 relates the analog error voltage to the digital ADC output, and except for the region near zero, it exhibits a linear relationship. But within the regulation bin 706 surrounding zero, the ADC digital output is mapped to zero rather than following the analog error voltage. This has the effect of creating a zero-error bin in the output voltage when it is very close to the reference value. The zero-error bin not only prevents small variations in the output voltage from triggering changes in the PWM synthesizer, but also makes possible the one-clock-cycle jittering of the PWM signal within the zero-error bin. If the output voltage varies beyond the regulation bin, the ADC output feeds a normal error voltage into the compensator. It should be appreciated that the size of the regulation bin is programmable and can be adjusted according to the requirements of the application.

One embodiment of a digital PWM control system in accordance with the present invention is implemented using an input voltage of 12 V, an output voltage of 2 V, a clock frequency of 200 MHz, and a switching frequency of 500 kHz. The compensator filter function is described by the equation:

$$d[n]=d[n-1]+e[n]-1.8125*e[n-1]+0.8203125*e[n-2].$$

The regulation bin of the ADC response function is set to be ±4 mV, or about ±0.2% of the two-volt output voltage. Experimental results show that this system has a fast transient response with a steady-state phase-noise jittering that is limited to 5 ns, or one clock period of the DPWM, under all loading conditions.

The foregoing description has disclosed several embodiments and many useful features of a novel design for a digital PWM controller that achieves low steady-state jittering without the need for a very-high-resolution digital PWM synthesizer. The selection of the error ADC sampling instant reduces noise in the error samples. A dithering scheme and a method of providing a zero-error band in the ADC eliminate the problem of limit cycling and reduce steady-state jittering to a single system clock cycle. Those skilled in the art will likely perceive other advantages and applications of the invention, and such would also fall within the scope and spirit of the present invention.

What is claimed is:

1. A power conversion system comprising:
   a switching converter including:
     an input voltage port;
     an output voltage port;
     an output filter operatively connected to the output voltage port; and
     at least one switch for selectively connecting the input voltage port to the output filter;
   an analog-to-digital converter (ADC) for sampling a voltage from the output voltage port of the switching converter, wherein the ADC has a non-uniform response characteristic comprising a regulation bin within which a change in the sampled voltage from the output port of the switching converter will produce no change in a digital output of the ADC;
   an error circuit configured to output an error signal comprising a difference between a reference signal and the digital output of the ADC;
   a compensator filter for filtering the error signal and producing a pulse width modulator (PWM) control signal; and
   a PWM module configured to receive the PWM control signal and to output a PWM waveform for alternately driving the at least one switch of the switching converter between an off state and an on state, and further wherein the PWM module is adapted to:
     alter a duty cycle of the PWM waveform in response to the PWM control signal;
     generate a timing strobe to cause the ADC to sample the voltage from the output port of the switching converter while the at least one switch of the switching converter is in the off state; and
     include a dithering circuit having a remainder accumulator wherein:
       the remainder accumulator receives a fractional portion of the PWM control signal and combines it with a current value in the remainder accumulator to produce a rolling remainder sum; and
       the remainder accumulator causes the PWM module to increase the duty cycle of the PWM waveform by one unit when the rolling remainder sum equals or exceeds one.

2. The power conversion system of claim 1, wherein the regulation bin of the ADC has an input voltage width that is programmable.

3. The power conversion system of claim 1, wherein the regulation bin of the ADC is set to extend from −4 millivolts to +4 millivolts.

4. The power conversion system of claim 1, wherein the timing strobe generated by the PWM module is further adapted to cause the ADC to sample the voltage from the output port of the switching converter immediately before the at least one switch of the switching converter is switched to the on state.

5. The power conversion system of claim 1, wherein the compensator filter is adapted to exhibit a proportional, integral, and differential (PID) character.

6. The power conversion system of claim 5, wherein the PID character of the compensator filter is achieved by implementing a response function characterized by $d[n]=d[n-1]+b0*e[n]-b1*e[n-1]+b2*e[n-2]$, wherein:
   $d[n]$ is the PWM control signal at a current sample time t;
   $d[n-1]$ is the PWM control signal at a sample time t−1;
   $e[n]$ is the error signal at the current sample time t;
   $e[n-1]$ is the error signal at the sample time t−1;
   $e[n-2]$ is the error signal at a sample time t−2;
   b0 is a first filter coefficient;
   b1 is a second filter coefficient; and
   b2 is a third filter coefficient.

7. The power conversion system of claim 6, wherein the first, second, and third filter coefficients are programmable.

8. The power conversion system of claim 6, wherein the first, second, and third filter coefficients are set as follows:
   b0=1;
   b1=1.8125; and
   b2=0.8203125.

9. The power conversion system of claim 1, wherein the dithering circuit causes the remainder accumulator to be reset to zero when the rolling remainder sum equals or exceeds one.

10. The power conversion system of claim 1, wherein the dithering circuit causes the rolling remainder sum to be replaced with the rolling remainder sum minus one when the rolling remainder sum equals or exceeds one.

11. A pulse width modulator (PWM) control system comprising:
   a PWM controller adapted to output a PWM waveform with a variable duty cycle; and a compensator filter adapted to receive an error signal and to produce a PWM control signal that is operatively coupled to the PWM controller such that the duty cycle of the PWM controller is varied in response to the PWM control signal, wherein:

the compensator filter has a response function described by $d[n]=d[n-1]+b0*e[n]-b1*e[n-1]+b2*e[n-2]$, wherein:

d[n] is the PWM control signal at a current sample time t;
d[n−1] is the PWM control signal at a sample time t−1;
e[n] is the error signal at the current sample time t;
e[n−1] is the error signal at the sample time t−1;
e[n−2] is the error signal at a sample time t−2;
b0 is a first filter coefficient;
b1 is a second filter coefficient; and
b2 is a third filter coefficient; and the PWM controller is adapted to include a dithering circuit including a remainder accumulator wherein:

the remainder accumulator receives a fractional portion of the PWM control signal and combines it with a current value in the remainder accumulator to producing a rolling remainder sum; and the remainder accumulator causes the PWM controller to increase the duty cycle of the PWM waveform by one unit when the rolling remainder sum equals or exceeds one.

12. The PWM control system of claim 11, wherein the first, second, and third filter coefficients of the compensator filter are programmable.

13. The PWM control system of claim 11, wherein the first, second, and third filter coefficients of the compensator filter are set as follows:

b0=1;
b1=1.8125; and
b2=0.8203125.

14. The PWM control system of claim 11, wherein the dithering circuit of the PWM controller causes the remainder accumulator to be reset to zero when the rolling remainder sum equals or exceeds one.

15. The PWM control system of claim 11, wherein the dithering circuit of the PWM controller causes the rolling remainder sum to be replaced with the rolling remainder sum minus one when the rolling remainder sum equals or exceeds one.

16. In a power conversion system comprising a power switch, an ADC for sampling an output voltage, a compensator filter for receiving an error voltage, and a pulse width modulator (PWM) controller for driving the power switch, a method for converting voltage comprises:

driving the power switch with a PWM waveform such that the power switch alternates between an on state and an off state;

generating a timing strobe such that the ADC samples the output voltage only when the power switch is in the off state;

configuring the ADC such that it includes a regulation bin within which a change in the sampled output voltage will produce no change in a digital output of the ADC;

creating an error signal by subtracting a reference value from the digital output of the ADC;

filtering the error signal in the compensator filter to produce a PWM control signal that is passed to the PWM controller;

adjusting a duty cycle of the PWM waveform in response to the PWM control signal, wherein the step of adjusting the duty cycle further comprises:

accumulating a fractional portion of the PWM control signal each time the ADC samples the output voltage to create a rolling remainder sum; and increasing the duty cycle of the PWM waveform by one unit when the rolling remainder sum equals or exceeds one.

17. The method for converting voltage of claim 16, wherein the step of generating the timing strobe further comprises adjusting the timing of the strobe to cause the ADC to sample the output voltage immediately before the power switch is switched to the on state.

18. The method for converting voltage of claim 16, wherein the step of configuring the ADC such that it includes a regulation bin further includes making a width of the regulation bin programmable.

19. The method for converting voltage of claim 16, wherein the step of configuring the ADC such that it includes a regulation bin further includes adjusting a width of the regulation bin to extend from −4 millivolts to +4 millivolts.

20. The method for converting voltage of claim 16, wherein the step of filtering the error signal in the compensator filter further comprises generating the PWM control signal from the error signal according to the following formula:

$$d[n]=d[n-1]+b0*e[n]-b1*e[n-1]+b2*e[n-2],$$

wherein:

d[n] is the PWM control signal at a current sample time t;
d[n−1] is the PWM control signal at a sample time t−1;
e[n] is the error signal at the current sample time t;
e[n−1] is the error signal at the sample time t−1;
e[n−2] is the error signal at a sample time t−2;
b0 is a first filter coefficient;
b1 is a second filter coefficient; and
b2 is a third filter coefficient.

21. The method for converting voltage of claim 20, further comprising the step of setting the first, second, and third filter coefficients to be:

b0=1;
b1=1.8125; and
b2=0.8203125.

22. The method for converting voltage of claim 16, wherein the step of accumulating a fractional portion of the PWM control signal further comprises resetting the rolling remainder sum to zero when it equals or exceeds one.

23. The method for converting voltage of claim 16, wherein the step of accumulating a fractional portion of the PWM control signal further comprises setting the rolling remainder sum to the rolling remainder sum minus one when the rolling remainder sum equals or exceeds one.

* * * * *